(12) United States Patent
Sosnowski

(10) Patent No.: US 7,263,756 B2
(45) Date of Patent: Sep. 4, 2007

(54) LANCE-TAB MOUNTING METHOD

(75) Inventor: Anthony M. Sosnowski, Stoudsburg, PA (US)

(73) Assignee: Laird Technologies, Inc., Delaware Water Gap, PA (US)

( * ) Notice: Subject to any disclaimer, the term of this patent is extended or adjusted under 35 U.S.C. 154(b) by 571 days.

(21) Appl. No.: 10/943,285

(22) Filed: Sep. 17, 2004

(65) Prior Publication Data

US 2005/0086786 A1 Apr. 28, 2005

Related U.S. Application Data

(60) Provisional application No. 60/503,831, filed on Sep. 18, 2003.

(51) Int. Cl.
B23P 11/00 (2006.01)
H05K 9/00 (2006.01)

(52) U.S. Cl. .................. 29/446; 29/450; 29/505; 29/521; 174/354; 174/355

(58) Field of Classification Search ............... 29/446, 29/450, 453, 505, 513, 521; 174/353, 354, 174/355, 350, 358; 361/818; 72/379.2, 72/379.6
See application file for complete search history.

(56) References Cited

U.S. PATENT DOCUMENTS

| 4,061,413 A | 12/1977 | Keller |
| 4,623,752 A | 11/1986 | Steen et al. |
| 5,001,297 A | 3/1991 | Peregrim et al. |
| 5,029,254 A | 7/1991 | Stickney |
| 5,120,903 A | 6/1992 | Tam |
| 5,204,496 A | 4/1993 | Boulay et al. |
| 5,523,527 A | 6/1996 | Mann et al. |
| 5,534,662 A | 7/1996 | Peacock et al. |
| 6,043,991 A | 3/2000 | Sorrentino |
| 6,225,555 B1 | 5/2001 | Sosnowski |
| 6,320,120 B1 | 11/2001 | Van Haaster |
| 6,403,879 B1 | 6/2002 | Clements et al. |
| 6,444,900 B1 | 9/2002 | Casey |
| 6,483,024 B1 | 11/2002 | Smithson et al. |
| 6,525,266 B2 | 2/2003 | Ferland et al. |
| 6,547,607 B2 | 4/2003 | Moll et al. |
| 6,639,147 B2 | 10/2003 | Thompson et al. |
| 6,744,641 B2 | 6/2004 | Schnabel |
| 6,774,301 B1 | 8/2004 | Kordes et al. |
| 6,946,598 B1 * | 9/2005 | Konshak .................... 174/354 |

FOREIGN PATENT DOCUMENTS

| GB | 2 184 294 A | 6/1987 |
| GB | 2184294 | 6/1987 |
| WO | WO 2005/029938 | 3/2005 |

* cited by examiner

Primary Examiner—Jermie E. Cozart
(74) Attorney, Agent, or Firm—Harness, Dickey & Pierce, P.L.C.

(57) ABSTRACT

A method for mounting a fingerstock EMI shielding gasket on a sheet metal structure includes the steps of forming tabs which protrude from the surface of the sheet metal structure. The shielding gasket, which has a generally D-shaped cross section with at least one mounting tab forming at least part of an upright portion therefor, is inserted into position longitudinally between the tabs.

31 Claims, 12 Drawing Sheets

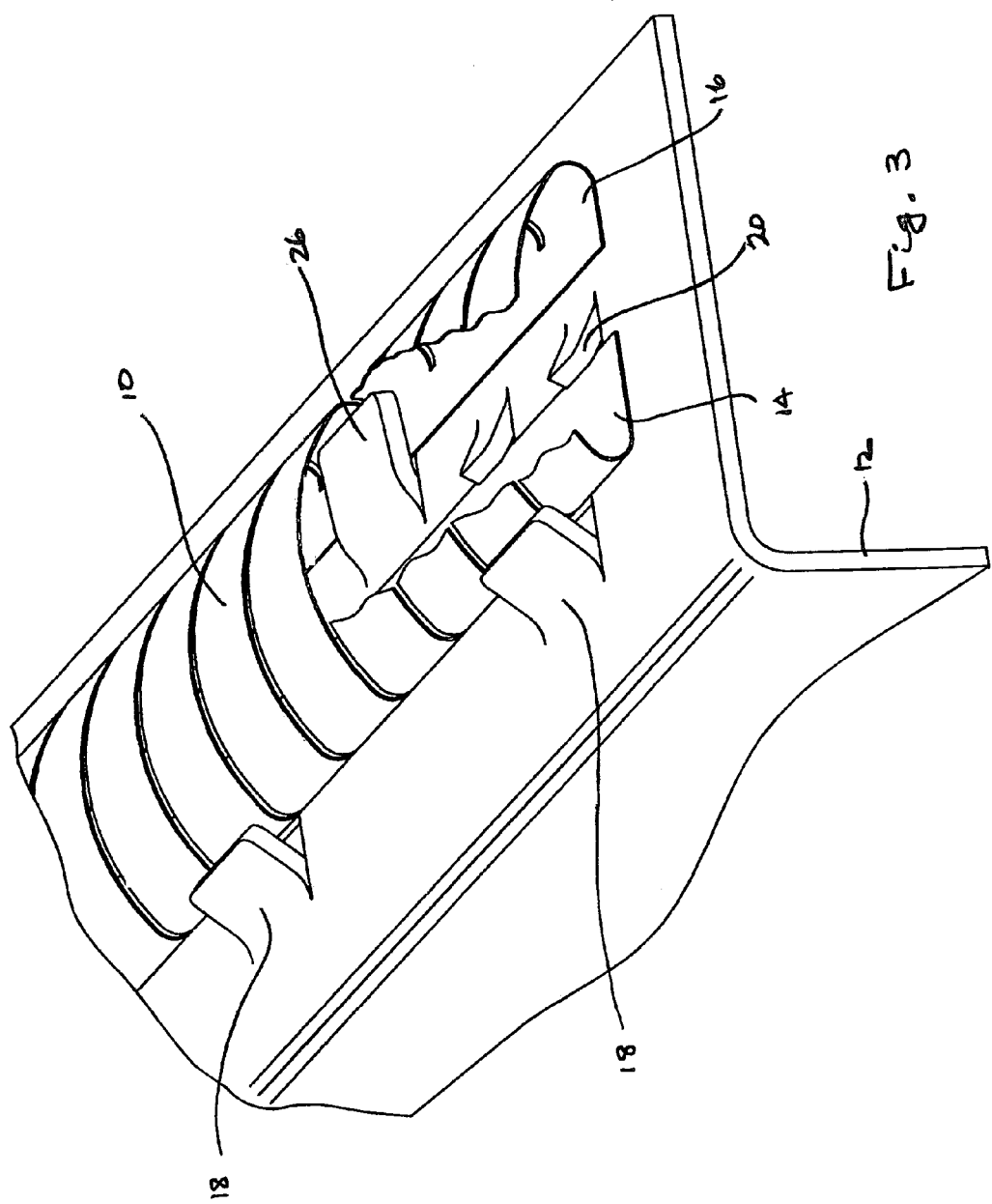

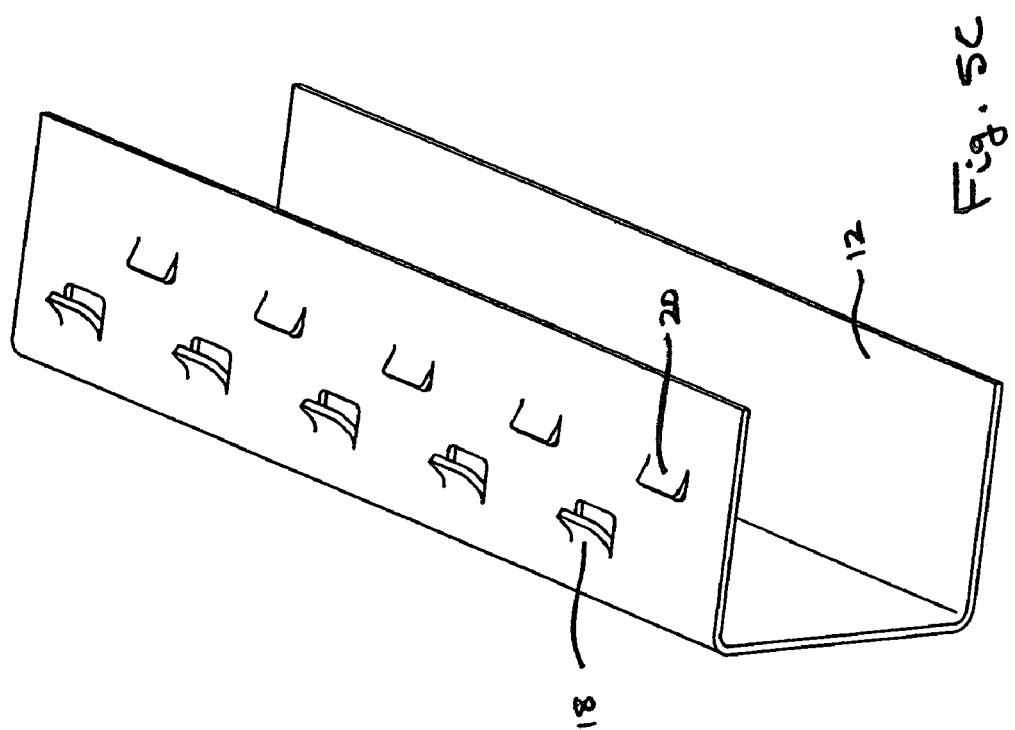

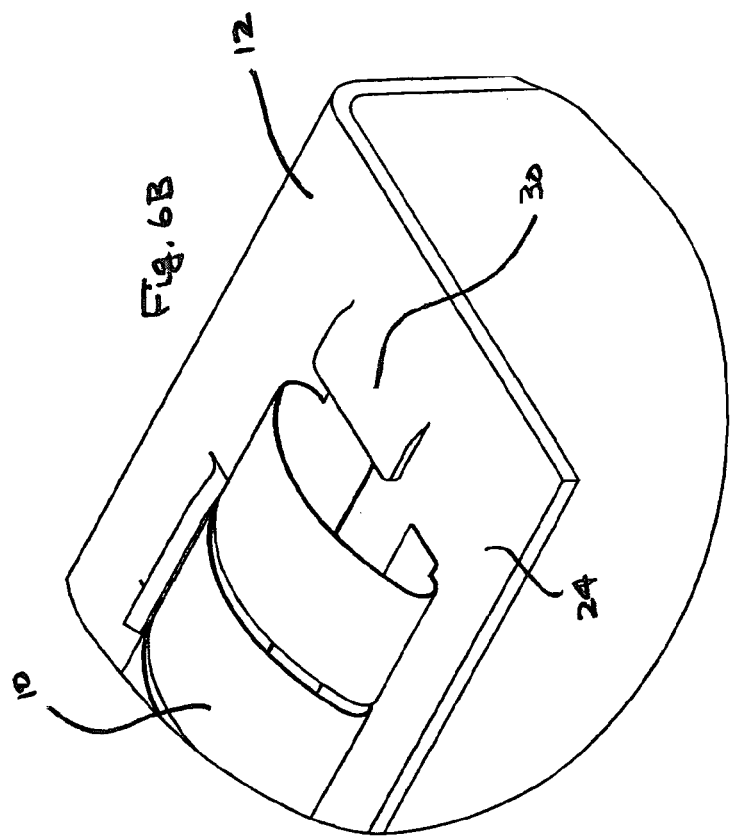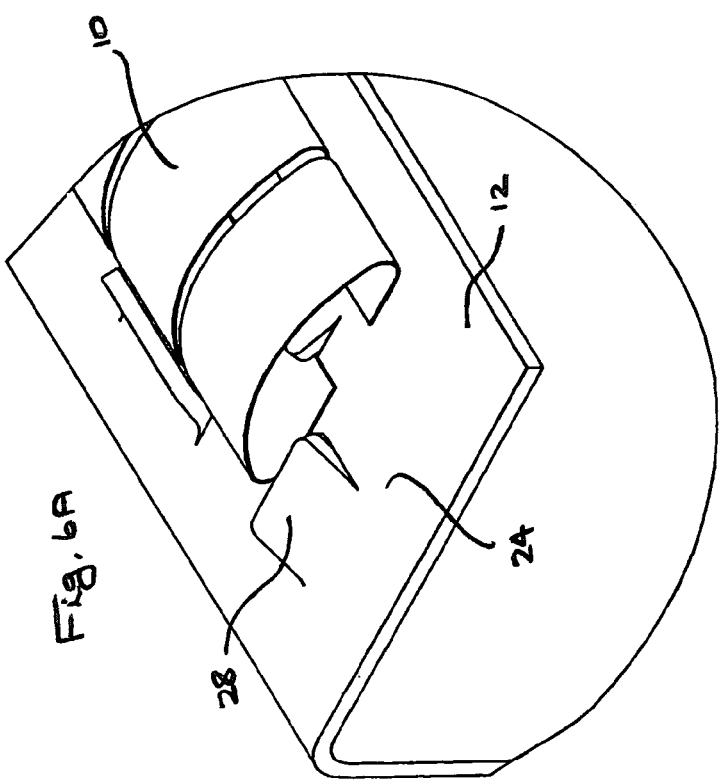

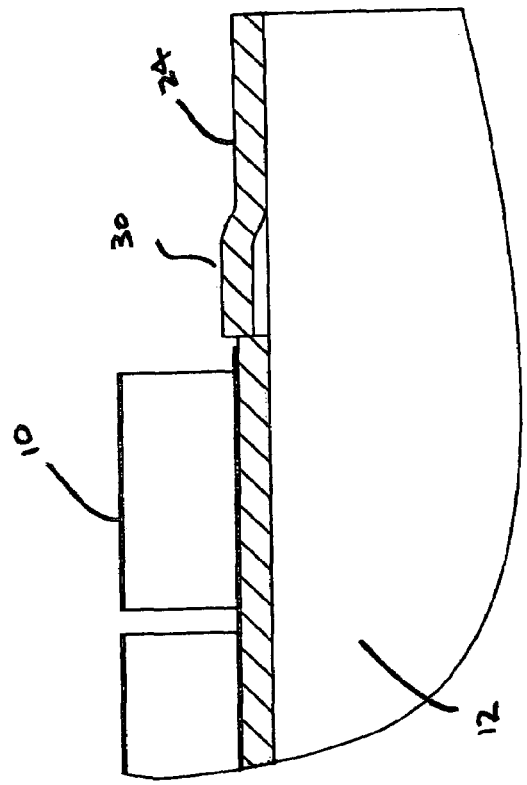
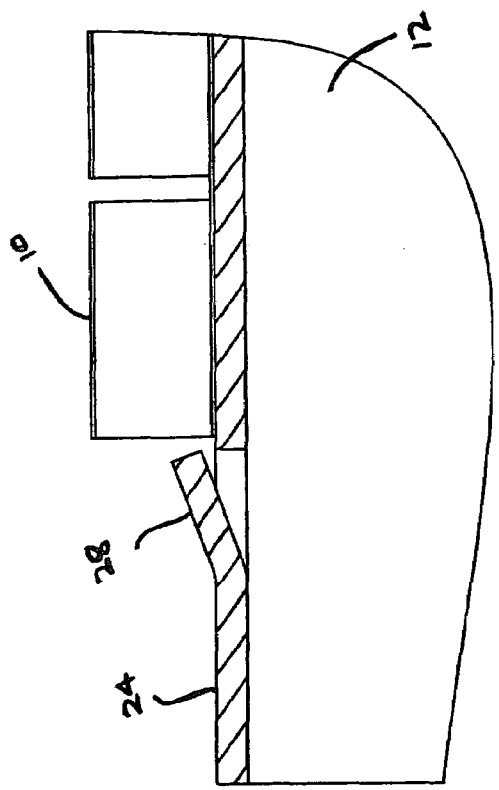
Fig. 7A
Fig. 7B

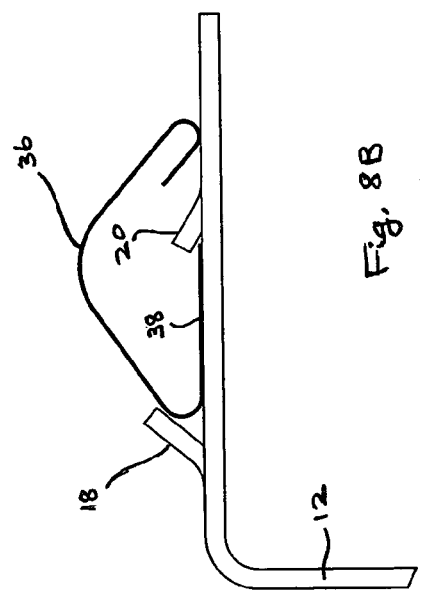
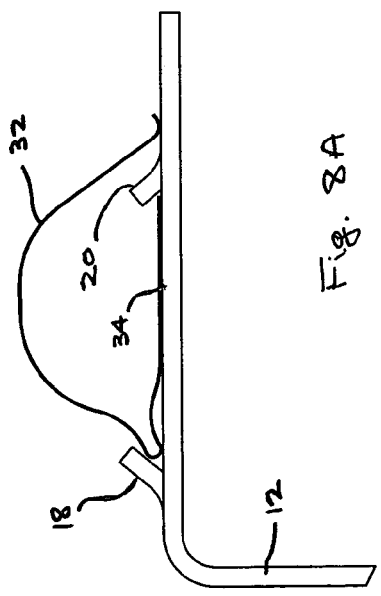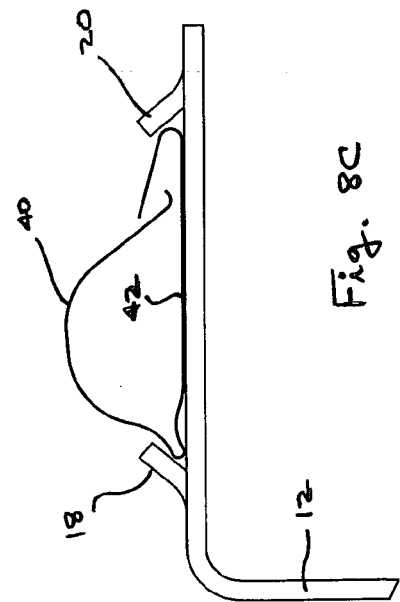

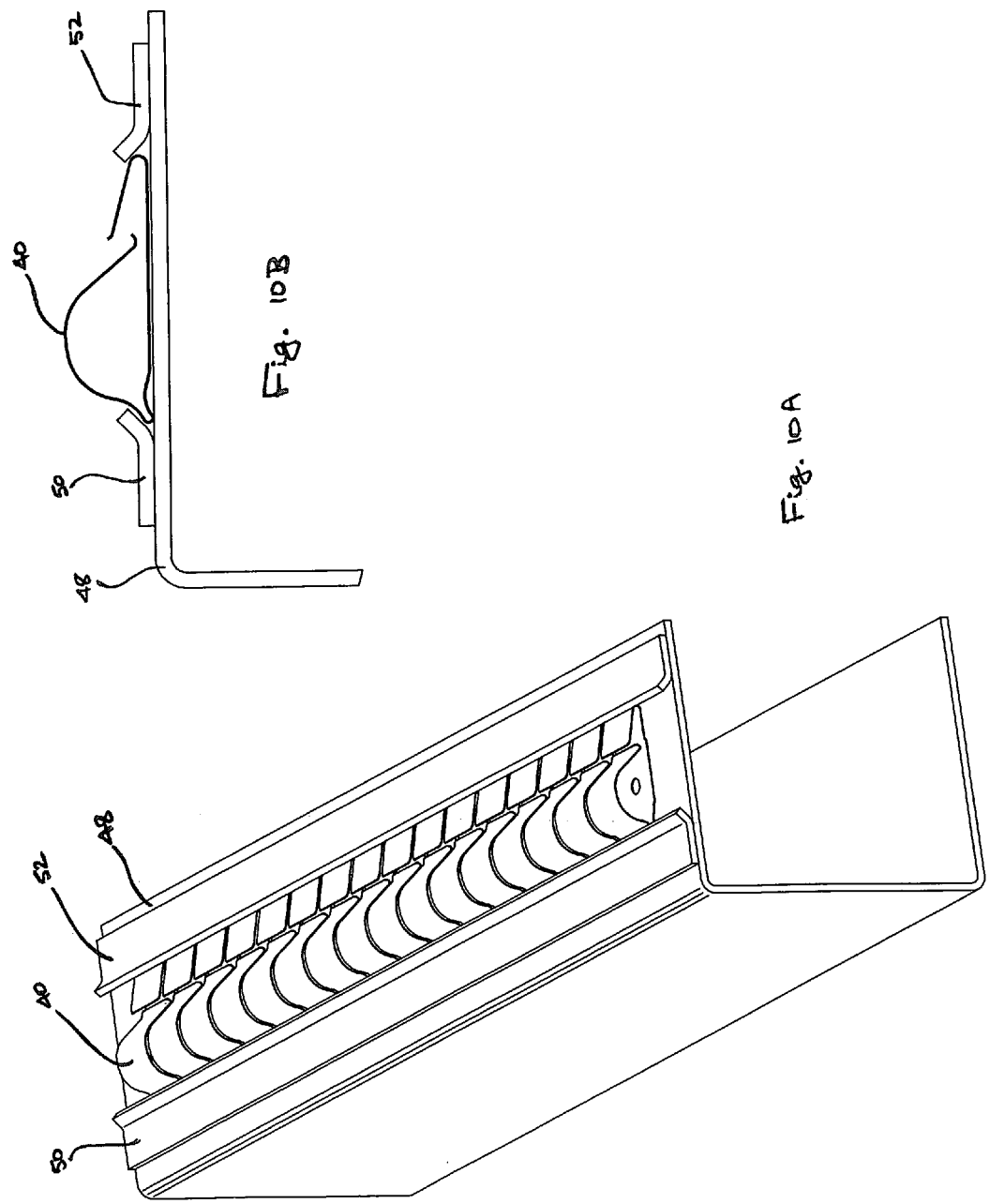

LANCE-TAB MOUNTING METHOD

CROSS REFERENCE TO RELATED APPLICATION

This application is based on U.S. patent application Ser. No. 60/503,831, filed Sep. 18, 2003, on which a claim for Convention priority is made in this application.

BACKGROUND OF THE INVENTION

1. Field of the Invention

The present invention relates generally to the provision of EMI shielding and specifically to the mounting of a fingerstock EMI shielding gasket on a sheet metal structure.

2. Description of the Prior Art

Fingerstock EMI shielding gaskets are well known in the art. Gaskets of this type are mounted for either wiping or compression closing applications on structures used to house circuit boards, such as those designed to plug into a rack for electronic equipment.

In the prior art, fingerstock gaskets have been mounted in a variety of ways. In one method, double-sided, pressure-sensitive adhesive (PSA) tape is used to hold the gasket in a desired position on the structure. Alternatively, rivets or mounting tracks, both of which include fastening means designed to engage into holes drilled or otherwise provided in the structure of interest, may be used. Finally, the gaskets may also be inserted into slots in the structure, clipped onto an edge of the structure, or welded or soldered into the position desired.

The present invention provides an alternative to these mounting methods of the prior art.

SUMMARY OF THE INVENTION

Accordingly, the present invention is a method for mounting a fingerstock EMI shielding gasket on a sheet metal structure. The shielding gasket has a generally D-shaped cross section with at least one mounting tab forming at least part of an upright portion therefor, and is of a variety well known to those of ordinary skill in the art.

The method comprises the steps of forming at least one outer tab and at least one inner tab from the sheet metal structure. The inner and outer tabs protrude outwardly from a surface of the sheet metal structure. The inner tabs are oriented generally toward the outer tabs and are laterally separated therefrom. The shielding gasket is slid longitudinally between the inner and outer tabs, one of its two mounting tabs being inserted beneath the inner tabs, to be secured between the inner and outer tabs.

In practice, a plurality of outer tabs and a plurality of inner tabs are aligned longitudinally in a direction parallel to an edge of the sheet metal structure. A second mounting tab of the shielding gasket may be directed generally beneath the edge of the sheet metal structure, or may reside on the surface of the sheet metal structure. Alternatively, anti-snag tabs, also protruding outwardly from a surface of the sheet metal structure, may be formed to hold the second mounting tab down on the surface to prevent snagging.

Moreover, longitudinal-retention tabs, protruding partially or completely from the surface of the sheet metal structure, may be provided to prevent the shielding gasket from shifting longitudinally out of position once it is slid thereinto between the inner and outer tabs.

The present invention will now be described in more complete detail with frequent reference being made to the figures identified below.

BRIEF DESCRIPTION OF THE DRAWINGS

FIG. 3 is a perspective view in which the gasket is partially cut away;

FIGS. 5A through 5E are perspective views showing several schemes by which the structure may be provided with outer, inner and anti-snag tabs;

FIGS. 6A and 6B are perspective views of ends of structures with gaskets held in position by longitudinal-retention tabs;

FIGS. 7A and 7B are side views of the ends shown in FIGS. 6A and 6B, respectively;

FIGS. 8A through 8C are end views, similar to that of FIG. 4C, showing the mounting of alternative varieties of fingerstock gaskets in accordance with the present invention;

FIGS. 10A and 10B are perspective and end views, respectively, of a gasket mounted on a structure in still another embodiment of the present invention.

DETAILED DESCRIPTION OF THE PREFERRED EMBODIMENTS

Figure 1:
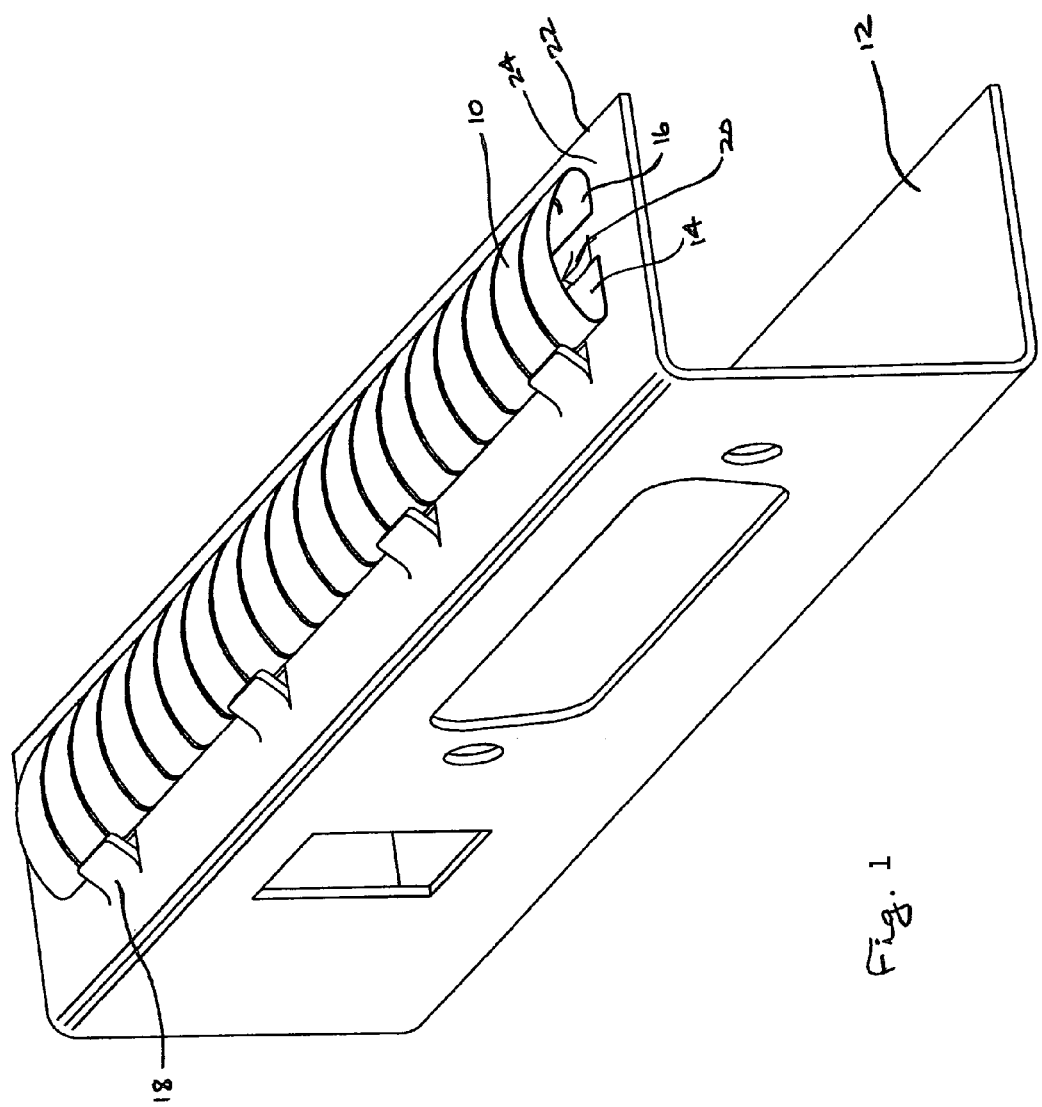
FIG. 1 is a perspective view of a gasket mounted on a structure in accordance with the method of the present invention.

Turning now to these figures, FIG. 1 is a perspective view of a fingerstock gasket 10 mounted on a structure 12 designed to hold a circuit board or other component of a piece of electronic equipment. In practice, the fingerstock gasket 10, which may be made of any of a variety of electrically conducting materials, provides EMI shielding when the structure 12 closely abuts against another component or structure in the piece of electronic equipment, thereby being compressed between the two and closing the gap between them against leakage of electromagnetic fields from within the equipment. This and other figures in the present application are intended to show the mounting of the fingerstock gasket 10 in accordance with the present invention, and not the specifics of every situation in which the gasket 10 may find use.

In accordance with the present invention, the fingerstock gasket 10 is mounted using tabs formed from the material from which the structure 12 is made. As shown in FIG. 1, as well as in the other figures, fingerstock gasket 10 has a generally D-shaped cross section with two mounting tabs 14,16. Outer tabs 18 and inner tabs 20, of which one may be seen in FIG. 1, are formed from the structure 12 itself. Outer tabs 18 and inner tabs 20 are stamped and formed from structure 12. Alternatively, tabs 18,20 may be produced by casting, for example, by die-casting, or by molding. As will be made more apparent in subsequent figures, fingerstock gasket 10 is mounted into position on structure 12 by sliding longitudinally therealong with mounting tab 14 captured between outer and inner tabs 18,20. The outer tab 18 can also serve as a down stop.

Figure 2:
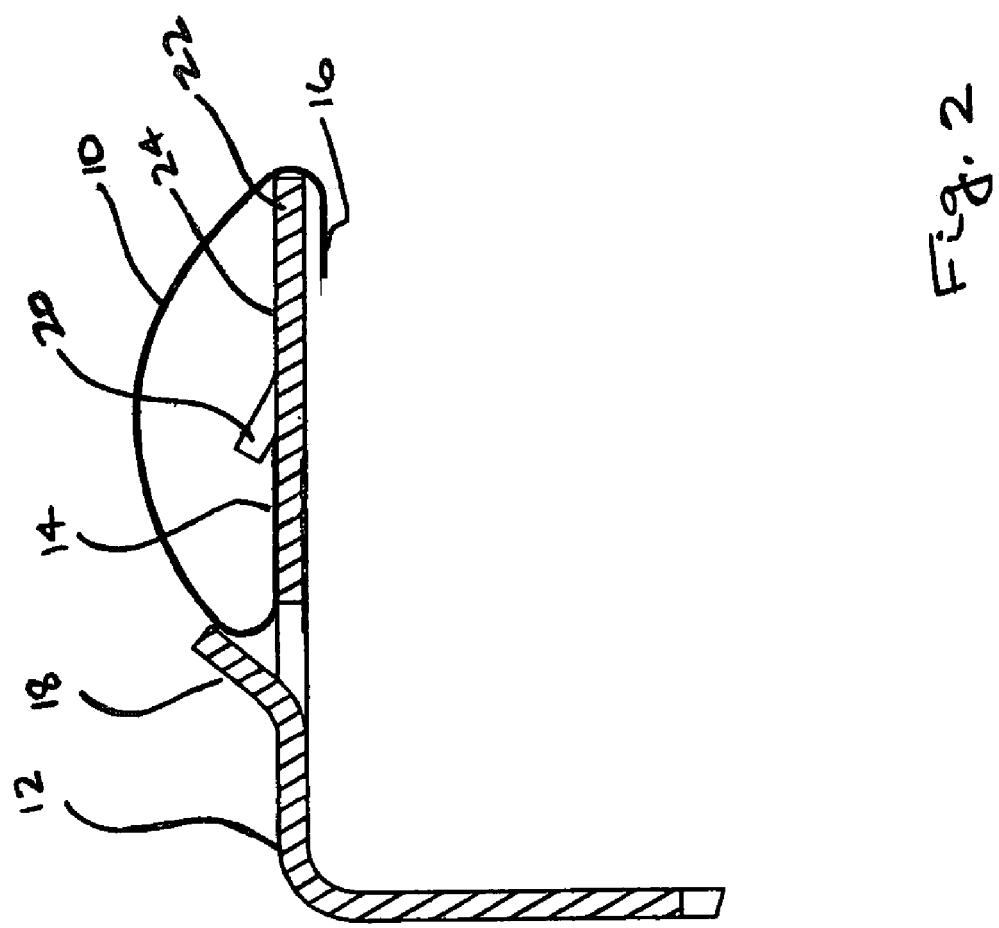
FIG. 2 is a cross-sectional view showing an alternative mounting method.

FIG. 2 is a cross-sectional view showing an alternative method for mounting the fingerstock gasket 10. In contrast to the view shown in FIG. 1, mounting tab 16 wraps around an edge 22 of the structure 12, instead of resting on its surface 24.

FIG. 3 is a perspective view, similar to that provided in FIG. 1. In FIG. 3, gasket 10 is partially cut away to show inner tabs 20 as well as an anti-snag tab 26. As in FIG. 1, mounting tab 14 of gasket 10 is captured between outer and inner tabs 18,20. In addition, mounting tab 16 of gasket 10 is secured under anti-snag tab 26, which, like tabs 18,20, is formed from the structure 12 itself. That is to say, anti-snag tab 26 is stamped and formed from structure 12, although it may alternatively be produced by casting, for example, by die-casting, or by molding. Anti-snag tab 26 is so called because it holds mounting tab 16 securely and prevents snagging as structure 12 is being mounted in a piece of electronic equipment. As was the case with the embodiment shown in FIG. 1, fingerstock gasket 10 is mounted into position on structure 12 by sliding longitudinally therealong with mounting tab 14 captured between outer and inner tabs 18,20 and mounting tab 16 disposed under anti-snag tab or tabs 26.

Figure 4A:
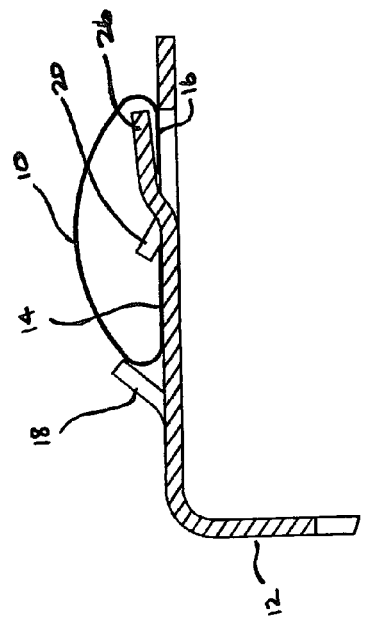
FIGS. 4A through 4D are views showing the gasket in relation to the outer, inner and anti-snag tabs.
Figure 4D:
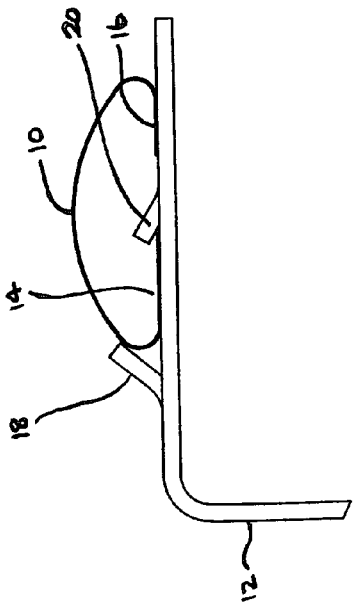
Figure 4B:
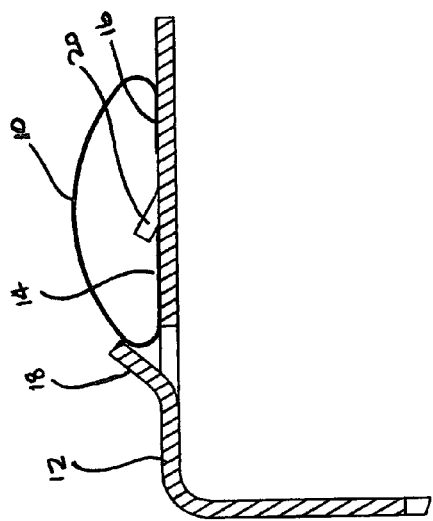
Figure 4C:
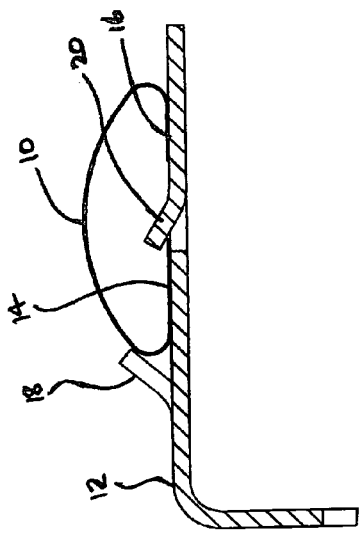

FIGS. 4A through 4D are views showing the gasket 10 and mounting tabs 14,16 in relation to the outer tab 18, inner tab 20 and anti-snag tab 26 of the structure 12. FIGS. 4A through 4C shown cross-sectional and end views of the embodiment shown in FIG. 1, which lacks anti-snag tabs 26. FIG. 4A is a cross-sectional view taken through one of the outer tabs 18; FIG. 4B is a cross-sectional view taken through one of the inner tabs 20; and FIG. 4C is an end view. In FIGS. 4A through 4C, mounting tab 14 of gasket 10 can be seen to be captured between outer tab 18 and inner tab 20. FIG. 4D is a cross-sectional view of the embodiment shown in FIG. 3. It is taken through an anti-snag tab 26. In addition to showing mounting tab 14 of gasket 10 captured between outer tab 18 and inner tab 20, it shows mounting tab 16 of gasket 10 held securely by anti-snag tab 26.

Figure 5B:
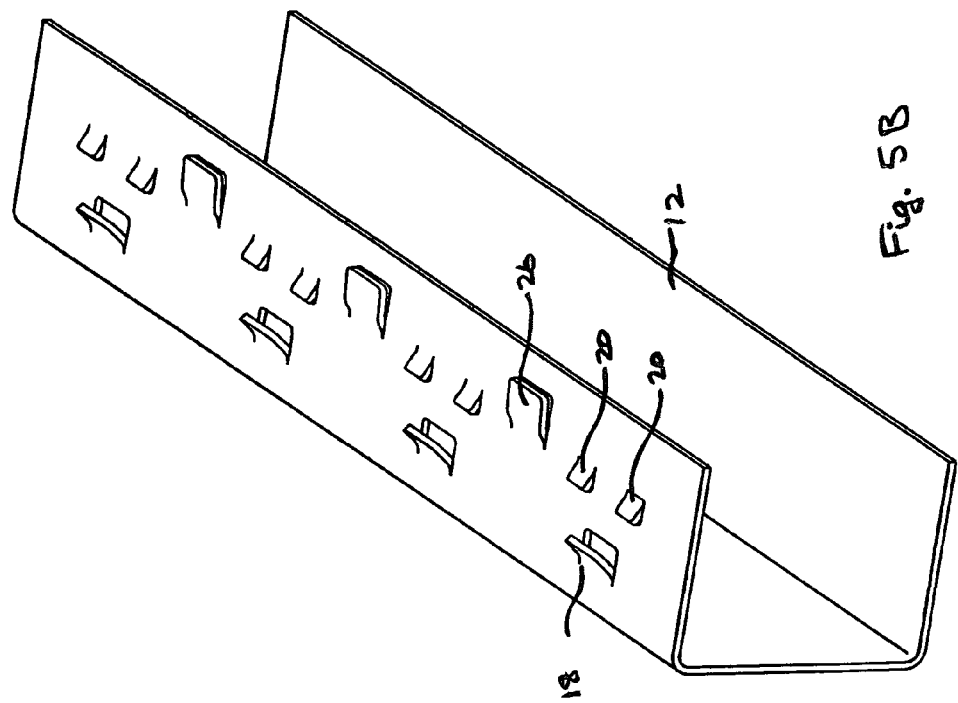
Figure 5A:
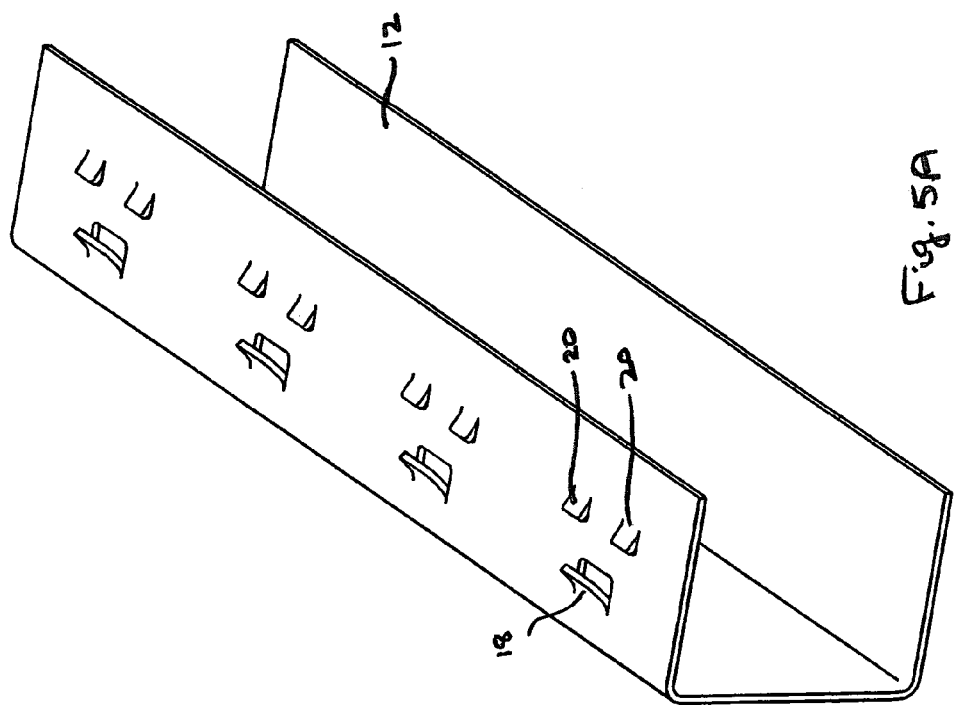

FIGS. 5A through 5E are perspective views showing several schemes by which structure 12 may be provided with outer tabs 18, inner tabs 20 and anti-snag tabs 26. FIG. 5A shows the basic scheme, which works best for short lengths of gasket 10. In this basic scheme, each outer tab 18 faces a pair of inner tabs 20.

In FIG. 5B, the outer tabs 18 and inner tabs 20 are disposed as in the basic scheme shown in FIG. 5A. An anti-snag tab 26 is also disposed between each pair of inner tabs 20.

Figure 5E:
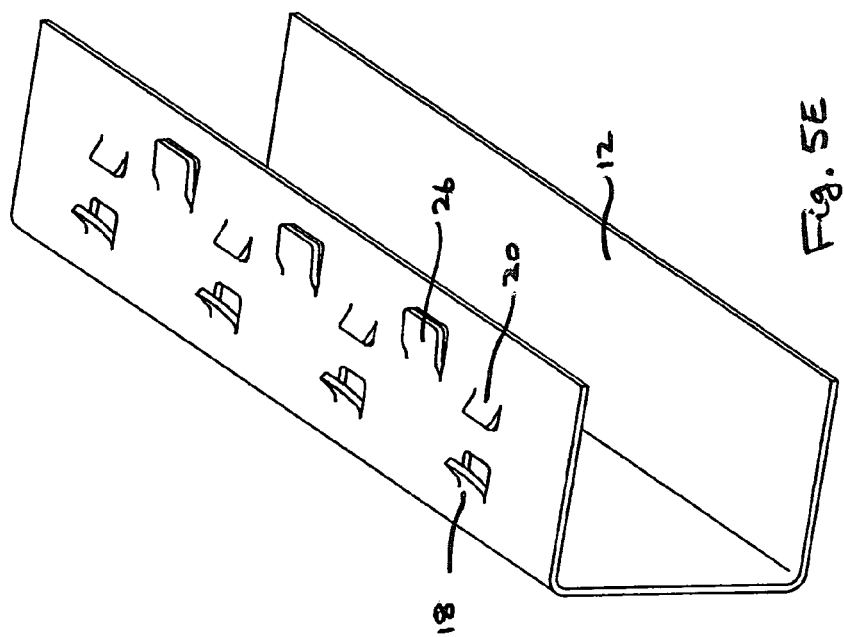
Figure 5D:
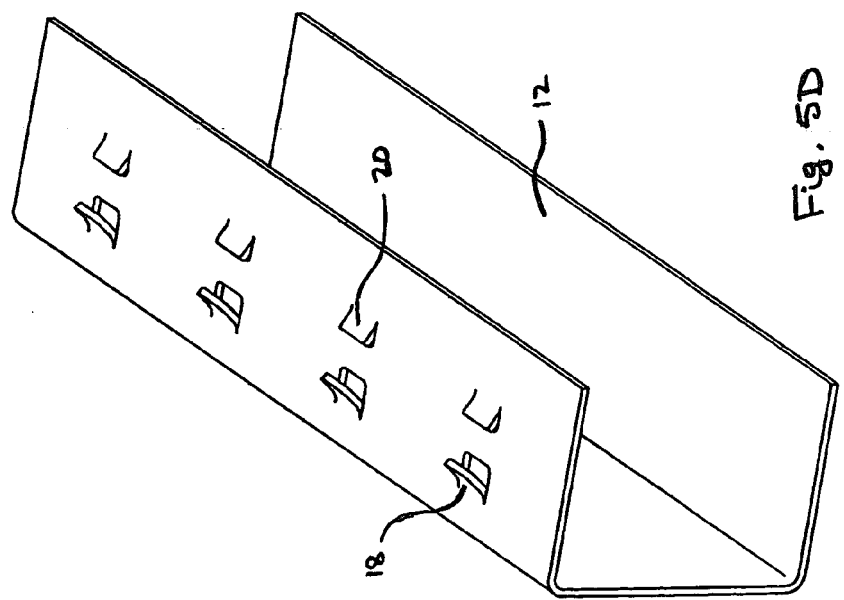

FIGS. 5C and 5D show schemes having the same numbers of outer tabs 18 and inner tabs 20. In FIG. 5C, the outer tabs 18 and inner tabs 20 are in staggered positions relative to one another; in FIG. 5D, the outer tabs 18 and inner tabs 20 are aligned with one another.

FIG. 5E shows a scheme like that of FIG. 5D wherein anti-snag tabs 26 are disposed between the inner tabs 20. This may also be done with the scheme shown in FIG. 5C.

In all of the schemes shown in FIGS. 5A though 5E, it should be understood that the outer tabs 18 are all longitudinally aligned on the structure 12. The same can be said for the inner tabs 18 and any anti-snag tabs 26 that may be present. This longitudinal alignment ensures that the gasket 10 may be longitudinally slid into position on the structure 12.

FIGS. 6A and 6B are perspective views of ends of structures 12 with fingerstock gaskets 10 held in position against longitudinal movement by longitudinal-retention tabs 28,30, which are stamped and formed from structure 12.

In FIG. 6A, longitudinal-retention tab 28 is fully sheared and protrudes completely above the surface 24 of the structure 12. In FIG. 6B, longitudinal-retention tab 30 is only partially sheared and protrudes less than its full thickness above the surface 24 of the structure 12.

FIGS. 7A and 7B are side views of the ends shown in FIGS. 6A and 6B, respectively. The difference between longitudinal-retention tab 28, which is fully sheared and protrudes completely above the surface 24 of the structure 12, and longitudinal-retention tab 30, which is only partially sheared and protrudes less than its full thickness above the surface 24 of the structure 12, is readily apparent in FIGS. 7A and 7B.

Alternatively, longitudinal-retention tabs 28,30 may be produced by casting, for example, by die-casting, or by molding.

FIGS. 8A through 8C are end views, similar to that of FIG. 4C, showing the mounting of alternative varieties of fingerstock gaskets in accordance with the present invention. In each of FIGS. 8A through 8C, structure 12 is again provided with outer tabs 18 and inner tabs 20 as previously described. In FIG. 8A, gasket 32, an all-purpose fingerstock gasket available from Laird Technologies, Inc. of Delaware Water Gap, Pa., U.S.A. (Series 97-540), is shown mounted between outer and inner tabs 18,20. Gasket 32 has only one mounting tab 34, in contrast to the symmetrical design of gasket 10 described above. FIG. 8B shows gasket 36, a no-snag fingerstock gasket also available from Laird Technologies, Inc. Gasket 36 is also shown mounted between outer and inner tabs 18,20, and also has only one mounting tab 38. FIG. 8C shows gasket 40, a foldover-series fingerstock gasket also available from Laird Technologies, Inc. Gasket 40 has only one mounting tab 42, which is folded back as shown in FIG. 8C, and which is captured between outer tab 18 and inner tab 20.

Figure 9B:
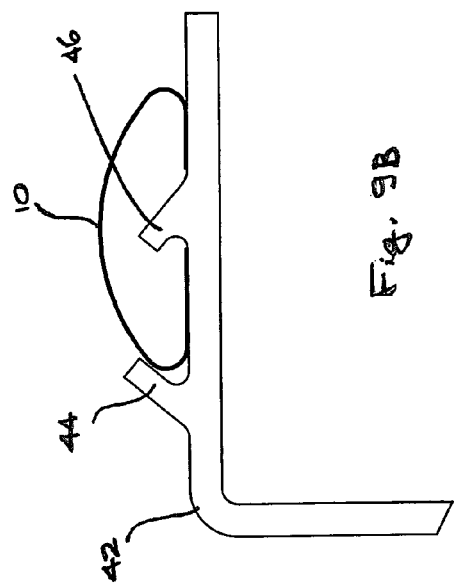
FIGS. 9A and 9B are perspective and end views, respectively, of a gasket mounted on a structure in an alternate embodiment of the present invention.
Figure 9A:
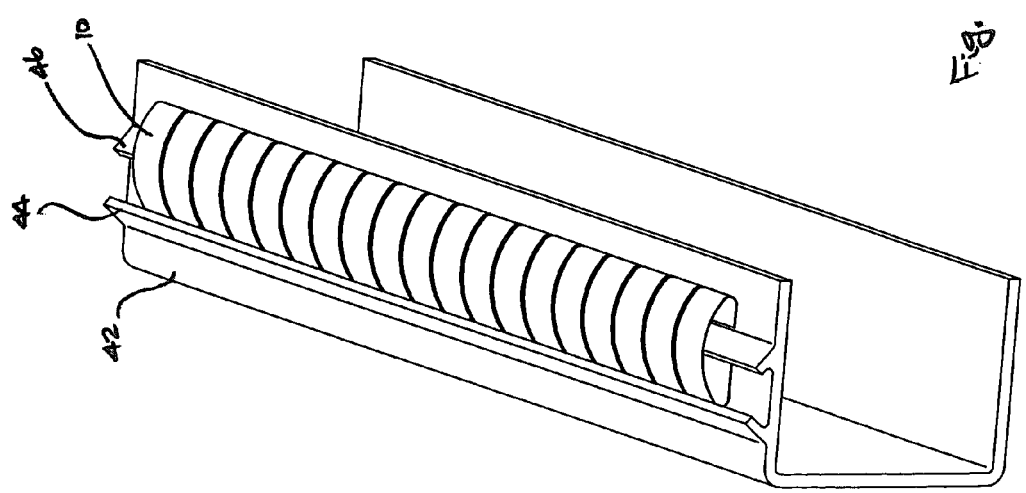

FIGS. 9A and 9B are perspective and end views, respectively, of a gasket 10 mounted on a structure 42. Structure 42 has outer tabs 44 and inner tabs 46 which are integrally formed therewith by extrusion or by casting. By producing tabs 44,46 by extrusion or by casting, shielding is improved because tabs 44,46 do not leave apertures in the structure 42.

FIGS. 10A and 10B are perspective and end views, respectively, of a gasket 40 mounted on a structure 48. Outer tabs 50 and inner tabs 52 are not integrally formed with structure 48, but, rather, are additional pieces attached to structure 48. Again, shielding is improved because tabs 50,52 do not leave apertures in structure 48.

Outer tabs 50 and inner tabs 52 are typically made from sheet metal, and are attached to structure 48 by welding, soldering, adhesives or fasteners, such as screws or rivets. Outer tabs 50 and inner tabs 52 may be full-length, like the extruded tabs 44,46 shown in FIGS. 9A and 9B, or may be segmented like the punched tabs shown in FIGS. 1 through 8C. Moreover, in this embodiment, outer and inner tabs 50,52 need not be of an electrically conductive material, and may be molded from plastic.

The present invention has several distinct advantages over the methods of the prior art. No adhesive tape is required to secure the fingerstock gaskets, and, as a consequence, no residue must be removed if they have to be replaced. Further, the positioning of the gaskets is repeatable and accurate and does not depend on operator skill with the present invention. Moreover, the cost of the gasket used in the present invention is less than those used in the track-mounted gaskets of the prior art. Finally, the tabs on the structures used in the practice of the present invention are smaller than the slot-mount openings used in the prior art, and, as a consequence, leak less electromagnetic radiation. In addition, with the present invention, the underside of the structure can be sealed against leakage, for example, with metal foil tape, since mounting tabs do not protrude through them.

Modifications to the invention would be obvious to those of ordinary skill in the art, but would not bring the invention so modified beyond the scope of the present invention.

What is claimed is:

1. A method for mounting a fingerstock EMI shielding gasket on a sheet metal structure, said shielding gasket having a generally D-shaped cross section with at least one mounting tab forming at least part of an upright portion therefor, said method comprising the steps of:
    a) forming at least one outer tab from said sheet metal structure, said outer tab protruding outwardly from a surface of said sheet metal structure;
    b) forming at least one inner tab from said sheet metal structure, said inner tab protruding outwardly from said surface of said sheet metal structure, said inner tab being oriented generally toward said outer tab and being laterally separated therefrom; and
    c) sliding said fingerstock EMI shielding gasket longitudinally between said inner and outer tabs with said mounting tab of said shielding gasket being inserted beneath said inner tab thereby securing said shielding gasket between said inner and outer tabs.

2. A method as claimed in claim 1 wherein a plurality of outer tabs is formed in step a), said plurality of outer tabs being aligned longitudinally in a direction parallel to an edge of said sheet metal structure.

3. A method as claimed in claim 1 wherein a plurality of inner tabs is formed in step b), said plurality of inner tabs being aligned longitudinally in a direction parallel to an edge of said sheet metal structure.

4. A method as claimed in claim 1 wherein a plurality of outer tabs is formed in step a), said plurality of outer tabs being aligned longitudinally in a direction parallel to an edge of said sheet metal structure, and a plurality of inner tabs is formed in step b), said plurality of inner tabs also being aligned longitudinally in a direction parallel to an edge of said sheet metal structure.

5. A method as claimed in claim 4 wherein two inner tabs are formed in step b) for every outer tab formed in step a).

6. A method as claimed in claim 4 wherein one inner tab is formed in step b) for every outer tab formed in step a).

7. A method as claimed in claim 6 wherein said inner and outer tabs are in staggered positions longitudinally along said sheet metal structure.

8. A method as claimed in claim 6 wherein said inner and outer tabs are aligned laterally with one another.

9. A method as claimed in claim 4 wherein said shielding gasket has a second mounting tab, said second mounting tab forming part of an upright portion of said generally D-shaped cross section, and further comprising the step of forming a plurality of anti-snag tabs from said sheet metal structure, said plurality of anti-snag tabs being aligned longitudinally in a direction parallel to an edge of said sheet metal structure, said plurality of anti-snag tabs being oriented in the same direction as said plurality of outer tabs and being laterally separated from said pluralities of inner and outer tabs and laterally farther from said plurality of outer tabs than from said plurality of inner tabs, said second mounting tab of said shielding gasket being inserted beneath said plurality of anti-snag tabs in step c).

10. A method as claimed in claim 9 wherein two inner tabs are formed in step b) for every outer tab formed in step a), and wherein one anti-snag tab is formed for every outer tab formed in step a), one anti-snag tab being disposed longitudinally between every other pair of inner tabs on said surface of said sheet metal structure.

11. A method as claimed in claim 9 wherein one inner tab is formed in step b) for every outer tab formed in step a), and wherein one anti-snag tab is formed for every outer tab formed in step a), one anti-snag tab being disposed longitudinally between each pair of inner tabs on said surface of said sheet metal structure.

12. A method as claimed in claim 11 wherein said inner and outer tabs are in staggered positions longitudinally along said sheet metal structure.

13. A method as claimed in claim 11 wherein said inner and outer tabs are aligned laterally with one another.

14. A method as claimed in claim 1 wherein said shielding gasket has a second mounting tab, said second mounting tab forming part of an upright portion of said generally D-shaped cross section, and wherein said second mounting tab of said shielding gasket is directed beneath an edge of said sheet metal structure in step c).

15. A method as claimed in claim 1 wherein said shielding gasket has a second mounting tab, said second mounting tab forming part of an upright portion of said generally D-shaped cross section, and wherein said second mounting tab of said shielding gasket is on a surface of said sheet metal structure in step c).

16. A method as claimed in claim 1 wherein said shielding gasket has a second mounting tab, said second mounting tab forming part of an upright portion of said generally D-shaped cross section, and further comprising the step of forming at least one anti-snag tab from said sheet metal structure, said anti-snag tab being oriented in the same direction as said outer tab and being laterally separated from said inner and outer tabs and laterally farther from said outer tab than from said inner tab, said second mounting tab of said shielding gasket being inserted beneath said anti-snag tab in step c).

17. A method as claimed in claim 1 further comprising the step of forming at least one longitudinal-retention tab from said sheet metal structure, said longitudinal-retention tab protruding outwardly from a surface of said sheet metal structure and being oriented laterally relative to said inner and outer tabs so that said fingerstock EMI shielding gasket may be secured against longitudinal movement between said inner and outer tabs.

18. A method as claimed in claim 17 wherein two longitudinal-retention tabs are formed from said sheet metal structure, one longitudinal-retention tab being disposed longitudinally on each side of said inner and outer tabs.

19. A method as claimed in claim 17 wherein said longitudinal-retention tab protrudes partially above said surface of said sheet metal structure.

20. A method as claimed in claim 17 wherein said longitudinal-retention tab protrudes completely above said surface of said sheet metal structure.

21. A method for mounting a fingerstock EMI shielding gasket on a metal structure, said shielding gasket having a generally D-shaped cross section with at least one mounting tab forming at least part of an upright portion therefor, said method comprising the steps of:
    a) forming at least one outer tab integrally with said metal structure, said outer tab protruding outwardly from a surface of said metal structure;
    b) forming at least one inner tab integrally with said metal structure, said inner tab protruding outwardly from said surface of said metal structure, said inner tab being oriented generally toward said outer tab and being laterally separated therefrom; and c) sliding said fingerstock EMI shielding gasket longitudinally between said inner and outer tabs with said mounting tab of said shielding gasket being inserted beneath said inner tab thereby securing said shielding gasket between said inner and outer tabs.

22. A method as claimed in claim 21 wherein forming steps a) and b) are carried out by extrusion.

23. A method as claimed in claim 21 wherein forming steps a) and b) are carried out by casting.

24. A method related to mounting a fingerstock EMI shielding gasket on a sheet metal structure, the fingerstock EMI shielding gasket having a generally D-shaped cross section with at least one mounting tab forming at least part of an upright portion therefore, the method comprising:

forming at least one outer tab from the sheet metal structure, the at least one outer tab protruding outwardly from a surface of the sheet metal structure, and forming at least one inner tab from the sheet metal structure, the at least one inner tab protruding outwardly from the surface of the sheet metal structure, the at least one inner tab being oriented generally toward the at least one outer tab and being laterally separated therefrom so as to allow sliding of the fingerstock EMI gasket longitudinally between the inner and outer tabs with the at least one mounting tab of the fingerstock EMI shielding gasket being positioned beneath the at least one inner tab of the sheet metal structure, to thereby secure the fingerstock EMI shielding gasket generally between the inner and outer tabs of the sheet metal structure.

25. A method as claimed in claim 24, further comprising sliding the fingerstock EMI shielding gasket longitudinally between the inner and outer tabs with the at least one mounting tab of the fingerstock EMI shielding gasket being positioned beneath the at least one inner tab of the sheet metal structure, thereby securing the fingerstock EMI shielding gasket generally between the inner and outer tabs of the sheet metal structure.

26. A method a claimed in claim 24, wherein the fingerstock EMI shielding gasket includes a second mounting tab forming part of an upright portion of the generally D-shaped cross section, and wherein the method further comprises forming at least one anti-snag tab from the sheet metal structure, the anti-snag tab being aligned longitudinally in a direction parallel to an edge of the sheet metal structure, the anti-snag tab being oriented in the same direction as the at least one outer tab and being laterally separated from the inner and outer tabs and laterally farther from the at least one outer tab than from the at least one inner tab, the anti-snag tab being configured to allow positioning of the second mounting tab of the fingerstock EMI shielding gasket generally beneath the at least one anti-snag tab, whereby the anti-snag tab helps hold the second mounting tab down on the surface of the sheet metal structure.

27. A method as claimed in claim 24, further comprising forming at least one longitudinal-retention tab from the sheet metal structure, the longitudinal-retention tab protruding outwardly from a surface of the sheet metal structure and being oriented laterally relative to the inner and outer tabs so that the fingerstock EMI shielding gasket may be secured against longitudinal movement between the inner and outer tabs.

28. A method for mounting a fingerstock EMI shielding gasket on a sheet metal structure, the fingerstock EMI shielding gasket having a generally D-shaped cross section with at least one mounting tab forming at least part of an upright portion thereof, the sheet metal structure having at least one inner tab and at least one outer tab that protrude outwardly from a surface of the sheet metal structure and that are aligned longitudinally in a direction parallel to an edge of the sheet metal structure, the inner and outer tabs being laterally separated, the method comprising:

sliding the fingerstock EMI shielding gasket longitudinally between the inner and outer tabs with the mounting tab of the fingerstock EMI shielding gasket being positioned beneath at least one inner tab of the sheet metal structure, thereby securing the fingerstock EMI shielding gasket generally between the inner and outer tabs of the sheet metal structure, wherein the fingerstock EMI shielding gasket has a second mounting tab, the second mounting tab forming part of an upright portion of the generally D-shaped cross section, and wherein the sheet metal structure further includes at least one anti-snag tab oriented in the same general direction as the at least one outer tab, the at least one anti-snag tab being laterally separated from the inner and outer tabs and laterally farther from the at least one outer tab than from the at least one inner tab, and wherein sliding the fingerstock EMI shielding gasket includes positioning the second mounting tab of the fingerstock EMI shielding gasket generally beneath the at least one anti-snag tab, whereby the anti-snag tab helps hold the second mounting tab down on the surface of the sheet metal structure.

29. A method as claimed in claim 28, wherein sliding the fingerstock EMI shielding gasket includes directing the second mounting tab beneath an edge of the sheet metal structure.

30. A method as claimed in claim 28, wherein the second mounting tab is on a surface of the sheet metal structure during the sliding of fingerstock EMI shielding gasket.

31. A method as claimed in claim 28, wherein the sheet metal structure further comprises at least one longitudinal-retention tab protruding outwardly from a surface of the sheet metal structure and being oriented laterally relative to the inner and outer tabs such that the fingerstock EMI shielding gasket may be secured against longitudinal movement between the inner and outer tabs.

* * * * *